(12) United States Patent
Ifis et al.

(10) Patent No.: US 11,081,416 B2
(45) Date of Patent: Aug. 3, 2021

(54) CONFIGURING A SEALING STRUCTURE SEALING A COMPONENT EMBEDDED IN A COMPONENT CARRIER FOR REDUCING MECHANICAL STRESS

(71) Applicant: AT&S Austria Technologie & Systemtechnik Aktiengesellschaft, Leoben (AT)

(72) Inventors: Abderrazzaq Ifis, Leoben (AT); Wolfgang Schrittwieser, Kapfenberg (AT); Christian Vockenberger, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/183,402

(22) Filed: Nov. 7, 2018

(65) Prior Publication Data

US 2019/0139848 A1 May 9, 2019

(30) Foreign Application Priority Data

Nov. 8, 2017 (EP) .................................... 17200694

(51) Int. Cl.
*H01L 23/31* (2006.01)
*H05K 3/46* (2006.01)
(Continued)

(52) U.S. Cl.
CPC ...... *H01L 23/3142* (2013.01); *H01L 23/3121* (2013.01); *H01L 23/3135* (2013.01);
(Continued)

(58) Field of Classification Search
CPC . H01L 23/31; H01L 23/3142; H01L 23/3121; H01L 23/3135; H01L 23/562
See application file for complete search history.

(56) References Cited

U.S. PATENT DOCUMENTS

| 6,094,138 A | 7/2000 | Eberhardt et al. |
| 2006/0120056 A1 | 6/2006 | Sasaki |

(Continued)

FOREIGN PATENT DOCUMENTS

| CN | 102074556 A | 5/2011 |
| CN | 106233462 A | 12/2016 |

(Continued)

OTHER PUBLICATIONS

Edmeades, Michael, Communication Pursuant to Article 94(3) EPC in Application No. 17 200 694.2; dated Jun. 5, 2020, pp. 1-6, European Patent Office, 80298, Munich, Germany.

(Continued)

*Primary Examiner* — Cuong Q Nguyen
(74) *Attorney, Agent, or Firm* — Robert A. Blaha; Smith Tempel Blaha LLC

(57) ABSTRACT

A component carrier including a stack of at least one electrically conductive layer structure and at least one electrically insulating layer structure, a component embedded in the stack, and a sealing structure sealing at least part of the component with regard to material of the stack, wherein the sealing structure is configured for reducing stress between the component and the stack.

14 Claims, 3 Drawing Sheets

(51) Int. Cl.
  *H05K 9/00*       (2006.01)
  *H05K 1/14*       (2006.01)
  *H01L 23/538*     (2006.01)
  *H01L 23/00*      (2006.01)

(52) U.S. Cl.
  CPC ........ *H01L 23/5389* (2013.01); *H01L 23/562* (2013.01); *H05K 1/144* (2013.01); *H05K 3/4688* (2013.01); *H05K 9/0015* (2013.01); *H05K 9/0088* (2013.01)

(56) References Cited

U.S. PATENT DOCUMENTS

| | | | |
|---|---|---|---|
| 2007/0134849 A1 | 6/2007 | Vanfleteren et al. | |
| 2011/0089573 A1* | 4/2011 | Kurita | H01L 23/3121 257/774 |
| 2011/0259630 A1 | 10/2011 | Park | |
| 2012/0086113 A1 | 4/2012 | Smith et al. | |
| 2013/0074331 A1 | 3/2013 | Brun | |
| 2015/0145107 A1 | 5/2015 | Ng | |
| 2017/0047296 A1* | 2/2017 | Watanabe | H01L 23/31 |
| 2018/0099480 A1* | 4/2018 | Kusumoto | B32B 7/02 |

FOREIGN PATENT DOCUMENTS

| | | |
|---|---|---|
| EP | 0 766 197 A1 | 4/1997 |
| JP | S61145696 A | 7/1986 |
| KR | 101 253 514 B1 | 4/2013 |
| WO | WO 2012/061091 A2 | 5/2012 |
| WO | WO 2013/066751 A1 | 5/2013 |
| WO | WO 2017/093281 A1 | 6/2017 |

OTHER PUBLICATIONS

Edmeades, M; Summons pusuant to Rule 115(1) EPC in Application No. 17 200 694.2; pp. 1-8; European Patent Office; 80298 Munich Germany.

Office Action (Translated) in Application No. 201811318327.8; pp. 1-7; China National Intellectual Property Administration; No. 6, Xitucheng Lu, Jimenqiao Haidian District, Beijing City; 100088; China.

Office Action in Application No. 201811318327.8; pp. 1-9; dated Dec. 14, 2020; China National Intellectual Property Administration; No. 6, Xitucheng Lu, Jimenqiao Haidian District, Beijing City; 100088; China.

Cover (Translated) Office Action in Application No. 201811318327.8; pp. 1-3; dated Dec. 14, 2020; China National Intellectual Property Administration; No. 6, Xitucheng Lu, Jimenqiao Haidian District, Beijing City; 100088; China.

* cited by examiner

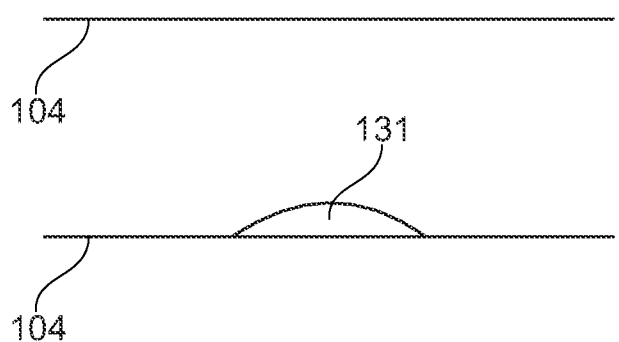
Fig. 6
Fig. 7
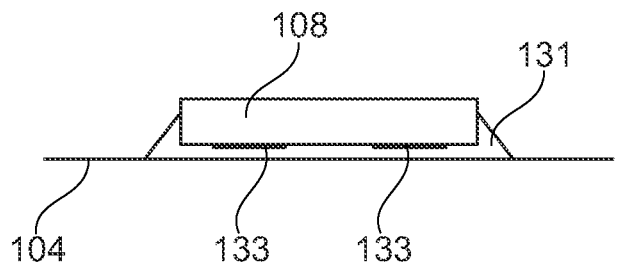
Fig. 8
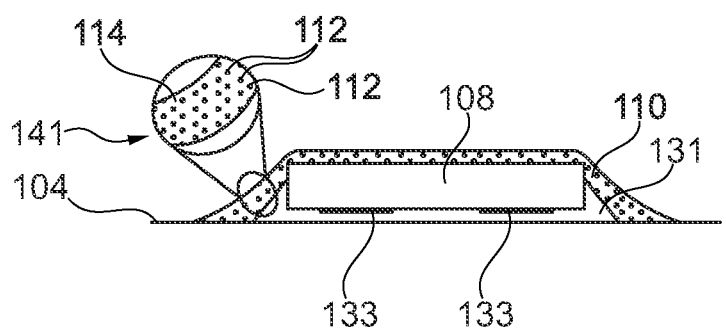
Fig. 9
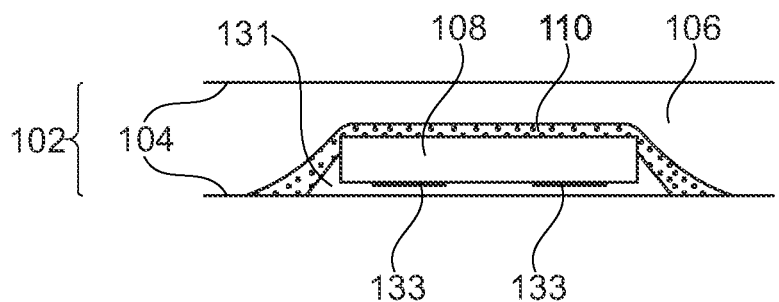
Fig. 10
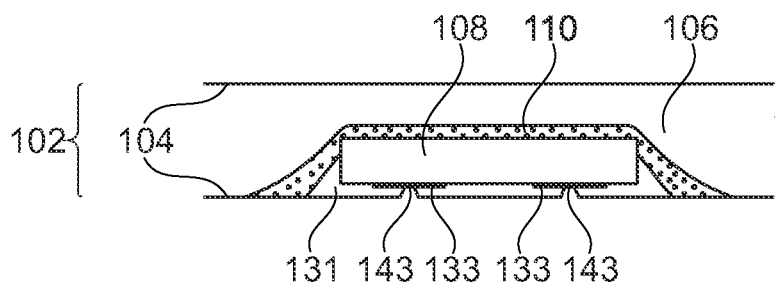
Fig. 11

CONFIGURING A SEALING STRUCTURE SEALING A COMPONENT EMBEDDED IN A COMPONENT CARRIER FOR REDUCING MECHANICAL STRESS

TECHNICAL FIELD

The invention relates to a component carrier, and a method of manufacturing a component carrier.

TECHNOLOGICAL BACKGROUND

In the context of growing product functionalities of component carriers equipped with one or more components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust so as to be operable even under harsh conditions.

SUMMARY

There may be a need to provide a reliable component carrier with an embedded component.

A component carrier and a method of manufacturing a component carrier according to the independent claims are provided.

According to an exemplary embodiment of the invention, a component carrier is provided which comprises a stack of at least one electrically conductive layer structure and at least one electrically insulating layer structure, a component embedded in the stack, and a sealing structure sealing (in particular sealingly spacing) at least part of the component with regard to material of the stack (in particular of the at least one electrically insulating layer structure), wherein the sealing structure is configured for reducing stress between the component and the stack (in particular the at least one electrically insulating layer structure).

According to another exemplary embodiment of the invention, a method of manufacturing a component carrier is provided, wherein the method comprises embedding a component in a stack comprising at least one electrically conductive layer structure and at least one electrically insulating layer structure, sealing at least part of the component with regard to material of the stack (in particular of the at least one electrically insulating layer structure) by a sealing structure, and configuring the sealing structure to reduce stress between the component and the stack (in particular the at least one electrically insulating layer structure).

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In the context of the present application, the term "component" may particularly denote any bulky rather than layer-type active (such as a semiconductor chip) or passive (for instance a copper block) component embedded within an interior of the component carrier.

According to an exemplary embodiment of the invention, a sealing structure may be provided to seal or serve as an impermeable spacer between an embedded component and an embedding stack of component carrier material. This sealing structure may be specifically adapted for reducing mechanical stress between the component and the stack of electrically insulating layer structures and/or electrically conductive layer structures. The provision of the sealing structure with the described configuration is the result of the finding that during an embedding procedure (which can involve a lamination procedure during which pressure and/or temperature are applied) the constituents of the component carrier may suffer from a significant amount of stress. This stress may be mechanical stress because the constituents may be made subject to a mechanical pressure during the encapsulation procedure. However, the stress may also be a thermal stress because a lamination procedure (which may be applied during the embedding) may involve a temperature increase so as to for instance re-melt curable material of the at least one electrically insulating layer structure to provide a robust interconnection of the constituents of the component carrier. Furthermore, chemically induced stress may occur resulting from a chemical modification (for instance cross-linking) during curing of resin of the one or more electrically insulating layer structures, which may in turn involve undesired phenomena such as shrinkage. Also different materials of different constituents of the component carrier with significantly different material properties (for instance in terms of thermal expansion, softness, etc.) being in close spatial relationship may generate stress. However, such mechanical and/or thermal and/or chemical stress may deteriorate or even damage the component (which can for instance be a sensitive semiconductor chip). Moreover, also a tendency of delamination between the layer structures of the stack may occur, since these layer structures also experience stress. Therefore, high tension forces may occur in an interior of the component carrier in particular at elevated temperature or during temperature cycles. The present inventors have surprisingly found that the provision of a sealing structure with an appropriate configuration of its physical properties may efficiently reduce this stress and may therefore prevent damage of the component and delamination of the stack. In a nutshell, an exemplary embodiment seals a component before embedding it in a stack of component carrier material for protecting the component from stress during processing (in particular forces exerted during embedding, during laser processing and/or during operation of the completed manufactured component carrier).

In the following, further exemplary embodiments of the component carrier and the method will be explained.

In an embodiment, the sealing structure is configured for reducing stress exerted during embedding and/or laser processing and/or operating the component carrier. Production, laser processing and operation of the component carrier may involve stress which can be reduced by the sealing structure. For that purpose, the sealing structure may be a relatively soft material to allow an equilibration motion when the component and/or stack constituents expand, contract or transmit forces within the component carrier. This increases the lifetime and the reliability of the component carrier.

In an embodiment, the sealing structure is arranged to shield resin material of the at least one electrically insulating layer structure with regard to the component. Such resin material may flow towards the component during an operation that embeds the component in the stack by lamination. According to the described embodiment, the sealing structure prevents resin from getting into direct interaction with the component. Such a resin may become flowable by re-melting during a lamination procedure while experiencing cross-linking. By interposing the sealing structure, the resin can be prevented from flowing up to the component. This increases the robustness and reliability of the component carrier.

In an embodiment, the sealing structure is arranged to shield or separate material of the at least one electrically insulating layer structure with regard to silicon (or another semiconductor) material of the component, or a ceramic material of a ceramic component. Silicon (or another semiconductor) material of a semiconductor chip constituting the component may be very sensitive to the presence of resin and/or reinforcing fibers of the at least one electrically insulating layer structure which may flow towards the component during lamination. However, due to the specific configuration of the sealing structure, such an undesired interaction may be safely prevented. The same holds for ceramic materials of which the component may be made.

In an embodiment, a value (for instance at a temperature of 300 K) of the Young modulus of the sealing structure is in between a value (for instance at a temperature of 300 K) of the Young modulus of resin material of the at least one electrically insulating layer structure and a value (for instance at a temperature of 300 K) of the Young modulus of silicon (or another semiconductor) material of the component. The Young modulus, also known as the elastic modulus, is a measure of the stiffness of a solid material and defines the relationship between stress (force per unit area) and strain (proportional deformation) in a material. A softer material has a smaller value of the Young modulus than a more rigid material. Thus, the softness of the sealing structure may be in between a softness of the component and a softness of the stack. Therefore, a smooth transition in terms of softness may be provided by the intermediate sealing structure. This also reduces the stress acting on the component and the tendency of the stack to delaminate, as well as will protect against vibrations or mechanical shocks by providing a damping function.

In an embodiment, a value (for instance at a temperature of 300 K) of the coefficient of thermal expansion (for instance a volumetric thermal expansion coefficient) of the sealing structure is in between a value (for instance at a temperature of 300 K) of the coefficient of thermal expansion (for instance a volumetric thermal expansion coefficient) of resin (in particular epoxy resin) material of the at least one electrically insulating layer structure and silicon (or another semiconductor) material of the component. When two materials with very different values of the coefficient of thermal expansion are directly connected next to one another, one of these constituents (in particular resin) strongly expands during a temperature increase, while the other one of these constituents (in particular silicon) experiences only a very small thermal expansion. This results in high thermal stress at the interface between these two materials. Sandwiching the sealing structure with an intermediate value of the coefficient of thermal expansion may reduce such thermal stress and may increase the lifetime and reliability of the component carrier.

In an embodiment, the sealing structure comprises or consists of resin (in particular epoxy resin) with filler particles comprising at least one of copper, a ceramic, and glass. It has turned out that specifically these materials may provide one or more of the herein described advantageous properties of reducing stress between component and stack. It is believed that the highly advantageous properties of the mentioned materials result from the fact that these materials provide only a very small material change with regard to their environment, in particular with regard to electrically insulating layer structures (frequently comprising a resin and reinforcing glass particles or fibers) and/or electrically conductive layer structures (frequently comprising copper) in a neighborhood. When the component is a ceramic component, ceramic particles smooth the gap concerning material properties between a component and a sealing structure. However, it should be appreciated that many other materials with material properties as described herein can be used as well as an appropriate material for the sealing structure.

In an embodiment, a material of the sealing structure has a value (for instance at a temperature of 300 K) of the thermal expansion coefficient (for instance a volumetric thermal expansion coefficient) in a range between 5 ppm/K and 40 ppm/K, in particular in a range between 10 ppm/K and 30 ppm/K. These values are in between typical values of semiconductor materials and typical values of dielectric printed circuit board materials of the stack. Therefore, with such values, it is possible to equilibrate thermal mismatch occurring due to very different values of the thermal expansion coefficient of adjacent materials.

In an embodiment, a value (for instance at a temperature of 300 K) of the Young modulus of the material of the sealing structure is in a range between 5 GPa and 500 GPa, in particular in a range between 10 GPa and 50 GPa. Such a relatively soft material may properly equilibrate intrinsic tension forces within the stack of the component carrier.

In an embodiment, a value (for instance at a temperature of 300 K) of the thermal expansion coefficient (for instance a volumetric thermal expansion coefficient) of the material of the sealing structure is in a range of ±30% or even ±10% around an average (in particular an arithmetic average) of the value (for instance at a temperature of 300 K) of the coefficient of thermal expansion (for instance a volumetric thermal expansion coefficient) of the material of the component and the value (for instance at a temperature of 300 K) of the coefficient of thermal expansion (for instance a volumetric thermal expansion coefficient) of the material of the at least one electrically insulating layer structure. These corridors or ranges have turned out as advantageous for significantly reducing stress acting on the component carrier.

In an embodiment, a value (for instance at a temperature of 300 K) of the Young modulus of the sealing structure is lower than an average (in particular an arithmetic average) value of the value (for instance at a temperature of 300 K) of the Young modulus of the material of the component and the value (for instance at a temperature of 300 K) of the Young modulus of the material of the at least one electrically insulating layer structure. For instance, the sealing material may be softer than silicon and more rigid than resin. This design rule has turned out as an efficient way of reducing the stress acting on the constituents of the component.

In an embodiment, the value (for instance at a temperature of 300 K) of the Young modulus of the sealing structure is in a range between 30% and 48% or even between 30% and 45% of a sum of the value (for instance at a temperature of 300 K) of the Young modulus of the material of the component and a value (for instance at a temperature of 300 K) of the Young modulus of the at least one electrically insulating layer structure. When the materials of the component, the stack and the sealing structure fulfill the mentioned conditions, a high reliability of the obtained component carrier can be achieved.

In an embodiment, the material of the sealing structure is configured for dissipating heat generated within the component carrier. In order to achieve this, the sealing structure may be made at least partially of a material having a high thermal conductivity, in particular having a conductivity of 50 W/mK or more. For instance, the sealing structure may comprise particles made of copper or aluminum having such a conductivity value. Heat generated by the component during operation of the component carrier may thus be efficiently removed from the component and out of the component carrier.

In an embodiment, the material of the sealing structure covers at least part of the component and at least part of the at least one electrically insulating layer structure. Therefore, the sealing structure may constitute the direct interface between component and stack. No further additional material needs to be provided for sufficiently reducing stress so that the reliability of the component carrier is high over a long term.

In an embodiment, the material of the sealing structure is configured for suppressing propagation of electromagnetic radiation, in particular radiofrequency radiation, between the component and an exterior of the sealing structure. In addition to the above described stress damping function, it has turned out to be possible to use the same sealing structure for stress reduction and also for suppressing propagation of electromagnetic radiation between an interior and an exterior of the sealed component. Such electromagnetic interference is a disturbing effect both in relation between the component carrier and the electronic periphery, but also between different components (for instance embodied as semiconductor chips) embedded within one and the same component carrier. By taking the described measure, the EMI (electromagnetic interference) characteristic of the component carrier may be significantly improved.

In an embodiment, the material of the sealing structure is configured for absorbing electromagnetic radiation, in particular radiofrequency radiation. This is particularly advantageous for high frequency applications which involve signals in the frequency range of GHz and above.

In an embodiment, the material of the sealing structure comprises shielding particles configured for shielding electromagnetic radiation. In particular, the particles may be selected from a group consisting of metallic particles, ferromagnetic particles, graphite particles, silver particles and nickel particles. Such shielding particles may be electrically conductive particles or, even more preferred, magnetic particles. For instance, the shielding particles may be iron or nickel particles. It has turned out possible that these shielding particles, for instance shaped as a sphere, are embedded in the sealing structure without disturbing the stress damping sealing function.

In an embodiment, the material of the sealing structure comprises a matrix, in particular a polymer matrix, in which the particles are embedded. Such a system can be a two-component system (i.e. polymer matrix and embedded particles), but may also comprise one or more additives. For instance, the matrix may be configured for stress reduction, whereas the particles may be configured for shielding electromagnetic radiation and/or for providing one or more additional or alternative function (such as heat removal), or vice versa.

In an embodiment, the method comprises simulating the stress behavior of a virtual (i.e. modelled, but not yet manufactured) component carrier with a virtual sealing structure and virtually modifying the configuration (in particular the material) of the virtual sealing structure when the simulation indicates a reduction of the stress with the modified configuration. After having modelled a virtual component carrier with appropriate virtual sealing structure, a corresponding physical component carrier with physical sealing structure may be manufactured. Such a trial and error procedure for designing the sealing structure has turned out as a powerful tool for improving or even optimizing performance of the sealing structure. Also theoretical assumptions and models may enable one to design appropriate material parameters of the sealing structure.

In an embodiment, the method comprises configuring the sealing structure based on one or preferably a combination of the criteria of:

at least partially balancing a mismatch between a value (in particular at 300 K) of the thermal expansion coefficient (for instance a volumetric thermal expansion coefficient) of the component and a value (in particular at 300 K) of the thermal expansion coefficient (for instance a volumetric thermal expansion coefficient) of the at least one electrically insulating layer structure; and at least partially balancing a mismatch between a value (in particular at 300 K) of the Young modulus of the component and of the at least one electrically insulating layer structure. Specifically an appropriate adjustment of these two parameters in combination can result in a significant reduction of stress.

In an embodiment, the method further comprises considering as a criterion for configuring the sealing structure a shrinkage behavior of a material of the at least one electrically insulating layer structure, in particular of resin material of the at least one electrically insulating layer structure. Resin shrinkage (in particular during lamination) has turned out as a significant source of distortion and generation of mechanical stress in an interior of the component carrier. This effect may in particular occur during lamination. If resin shrinks on silicon material of the component, high stress may be generated. If resin shrinks on other material of the component carrier, deformation of the component carrier can occur, this may result in delamination, warpage or bending. By considering resin shrinkage for the design of the sealing structure, reliability of the component carrier may be further increased. In particular, it has turned out that stress forces as a result of shrinkage are lower when the Young modulus of the material of the sealing structure is sufficiently low.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular materials coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force, if desired accompanied by heat.

BRIEF DESCRIPTION OF THE DRAWINGS

FIG. 6, FIG. 7, FIG. 8, FIG. 9, FIG. 10 and FIG. 11 illustrate different cross-sectional views of structures obtained during carrying out a method of manufacturing a component carrier according to another exemplary embodiment of the invention.

DETAILED DESCRIPTION OF ILLUSTRATED EMBODIMENTS

Figure 1:
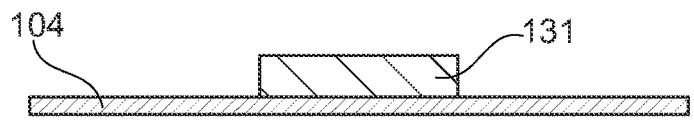
FIG. 1, FIG. 2, FIG. 3, FIG. 4 and FIG. 5 illustrate different cross-sectional views of structures obtained during carrying out a method of manufacturing a component carrier according to an exemplary embodiment of the invention.

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

Before, referring to the drawings, exemplary embodiments will be described in further detail and some basic considerations will be summarized based on which exemplary embodiments of the invention have been developed.

According to an exemplary embodiment, a highly reliable embedded component carrier or package is provided which is manufactured by a sealing process. This enables an easier and highly reliable embedding process. Moreover, such a manufacturing architecture allows or enables protection of embedded parts during a pressing cycle of an embedding process. Furthermore, it is possible to reduce or even minimize the residual stress inside the embedded parts due to resin and/or adhesive shrinkage. Also a CTE (coefficient of thermal expansion) mismatch between dielectric material, adhesive and one or more embedded components may be reduced or even minimized. Exemplary embodiments of the invention furthermore enable an improvement in the accuracy of registration. The provided manufacturing architecture furthermore enables an operator to embed thin components or parts in a component carrier. However, also big components or parts may be embedded according to an exemplary embodiment of the invention. It is furthermore possible to embed different component sizes in the same stack (for instance core of fully cured material) and with the same pressing cycle.

According to an exemplary embodiment of the invention, the following process scheme may be carried out: Glue or adhesive may be printed on an electrically conductive foil as electrically conductive layer structure. Thereafter, a degassing process may be carried out. After that, the glue may be cured. Then, an assembly process may be executed for placing a component on the adhesive. In a subsequent procedure, it is possible to seal the component to be embedded by covering it with a protective insulating material, thereby forming the sealing structure. Preferably, the protective material may have a lower or even significantly lower Young modulus than the component materials. Further preferably, the protective material may be bubble free. Its thickness and shape may be selected depending on the component shape (aspect ratio), a cavity size and the covering material properties. It is also possible to apply a degassing process under vacuum. Moreover, the covering material may be cured. Dielectric material as electrically insulating layer structure may be cut. A lay-up process may be carried out. Thereafter, a pressing process can be executed for lamination. The sealing material may reduce stress occurring during the mentioned and/or other processes.

During a conventional embedding process, the components to be embedded may get broken due to the high stress level during the pressing cycle. This stress is driven by resin shrinkage, a temperature gradient and an applied pressure. If the size of the cavity is big while the components are thin, the latter may get loaded by a bending stress that may lead to their failure.

In contrast to such conventional approaches, exemplary embodiments of the invention provide one or more of the above mentioned and/or of the following improvements.

The embedding process is divided into two separate procedures, i.e. first sealing and then laminating. Indeed, the shrinkage effect can be more pronounced when the adhesive volume is important. Indeed, the protective material may be already in solid state which means the shrinkage is limited to the free volume in the cavity.

The chosen material for sealing may be selected to have a quite low CTE. Thus, the CTE mismatch during the pressing cycles may be reduced. Thereby, the residual stress may also be significantly reduced.

The material for sealing may be choosing to have a quite low Young modulus. Thus, the mismatch of the component modulus with the embedding adhesive is lower. Then, the stress concentration may be lower in the interface. Also, the lower modulus of the protective layer allows transforming the energy into strain instead of stress in the component.

The embedded component may be protected from all contamination or corrosion by the sealing structure.

The sealed components may be easy for embedding and may provide high mechanical, thermal, chemical and electrical reliability. They may also provide easy and precise registration and heat distribution.

According to another aspect of embodiments of the invention, the shielding of embedded electronic components of a component carrier such as a printed circuit board with regard to electromagnetic distortions can be accomplished by a coating with metal filled resin constituting the sealing structure. Hence, the coating of the component may also be denoted as sealing structure.

When operation frequencies in terms of high frequency applications increase with the increasing complexity of electromagnetic circuitry, corresponding components (in particular high frequency semiconductor chips) become also more sensitive with regard to distortions due to electromagnetic interference (EMI). It is also possible that embedded electronic components such as semiconductor chips of one and the same component carrier also interfere in an undesired way. In order to overcome corresponding shortcomings, an exemplary embodiment of the invention provides a sealing structure shielding electromagnetic radiation between the component and an electronic periphery within and outside of the component carrier. By arranging the sealing structure directly on the component, a high local shielding is possible which enables shielding with a reduction in effort (in particular with a low amount of material) and high efficiency (since stray fields may be efficiently suppressed due to the close spatial vicinity).

An exemplary embodiment of the invention thereby provides a printed circuit board with embedded electronic component(s) which is/are covered by a shielding sealing structure in order to improve the electromagnetic radiation emission and absorption properties. This increases the reliability of the printed circuit board (or any other type of component carrier, such as an IC substrate). This can be accomplished by arranging the shielding sealing structure directly at the location where the electromagnetic distortion is generated, i.e. at a direct surrounding of the one or more components. Such a component may for instance be a microprocessor which can be provided with such a shielding in a highly advantageous way.

Thereby, the electromagnetic interference characteristics between different components of one and the same component carrier as well as between an embedded component and an electronic periphery may be improved. For example, a correspondingly configured sealing structure may be a coating film on epoxy basis with a metal filling. Experiments have shown that particle materials such as graphite, silver and nickel have a particularly high efficiency in terms of absorbing electromagnetic radiation in a polymer base.

Additionally or alternatively, a control of the thickness of the shielding structure and/or an adaptation of the amount of ferromagnetic filling particles in a polymer matrix are appropriate design parameters for improving or optimizing the electromagnetic radiation shielding function.

FIG. 1 to FIG. 5 illustrate different cross-sectional views of structures obtained during carrying out a method of manufacturing a component carrier 100 according to an exemplary embodiment of the invention.

FIG. 1 shows a copper foil as electrically conductive layer structure 104 on which a liquid adhesive 131, for instance an epoxy-based adhesive, is dispensed, printed, deposited or applied in another way.

Figure 2:
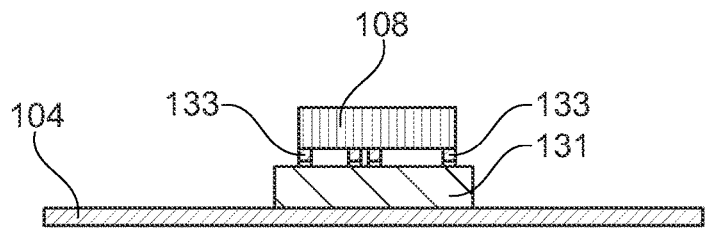

FIG. 2 shows that, after curing the adhesive 131, an electronic component 108 (such as a semiconductor chip) is attached to the structure shown in FIG. 1 by attaching or immersing it onto or into the adhesive 131. It can be taken from FIG. 2 that pads 133 of the electronic component 108 are oriented downwardly, which is also denoted as a face-down configuration of the electronic component 108. However, also face-up arrangements are possible where the pads 133 are arranged on the (according to FIG. 2 upper) main surface of the electronic component 108 opposing the electrically conductive layer structure 104. Furthermore, pads 133 may also be foreseen on both opposing main surfaces of the electronic component 108.

Figure 3:
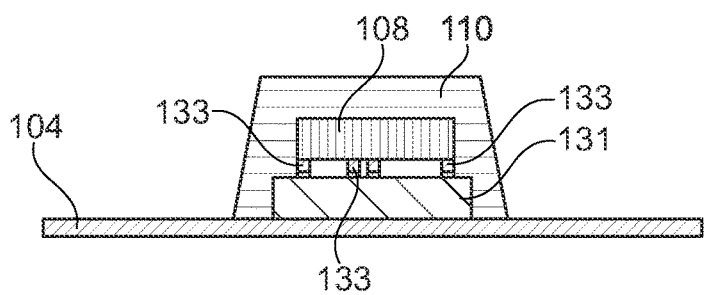

Referring to FIG. 3, the component 108 is then sealed with regard to material of an electrically insulating layer structure 106 to be added later (compare FIG. 4) by a sealing structure 110 forming a cap or lid with substantially inverted U-shape. Material of the sealing structure 110 may be applied in a liquid or viscous phase so as to hermetically enclose the electronic chip 108 in combination with the adhesive 131. Advantageously, the sealing structure 110 may be configured to reduce stress between the component 108 and the electrically insulating layer structure 106 to be connected subsequently.

In order to properly configure the sealing structure 110, it is also possible that the stress behavior of the component carrier 100 with the sealing structure 110 is simulated or modelled prior to the actual manufacture of the component carrier 100. The material configuration of the sealing structure 110 may be modified (virtually, i.e. in the framework of the simulation, or physically, i.e. using a modified material during manufacture) when the simulation indicates a reduction of the stress with the modified material configuration of the sealing structure 110.

One or more of the following design or selection criteria may be applied for configuring the material, shape, volume and/or position of the sealing structure 110:

balancing a mismatch between a value of the thermal expansion coefficient (CTE) of the component 108 on the one hand and a value of the thermal expansion coefficient of the electrically conductive layer structure 104 and/or of the electrically insulating layer structure 106 on the other hand;

balancing a mismatch between a value of the Young modulus of the component 108 on the one hand and of the electrically conductive layer structure 104 and/or of the electrically insulating layer structure 106 on the other hand;

considering a shrinkage behavior of resin material of the electrically insulating layer structure 106 and/or of material of the adhesive 131.

However, it is also possible that, additionally or alternatively, one or more other design parameters is or are considered for designing the sealing structure 110.

In accordance with such a selection or design using one or more of the above considerations or criteria, as shown in FIG. 3, the sealing structure 110 is applied to cover the component 108, the adhesive 131 and the electrically conductive layer structure 104, for instance by dispensing, printing or in another way. This coverage is performed so that any direct contact between the component 108 and the electrically insulating layer structure(s) 106 is disabled or made impossible and the component 108 is protected within the lid-like sealing structure 110.

Figure 4:
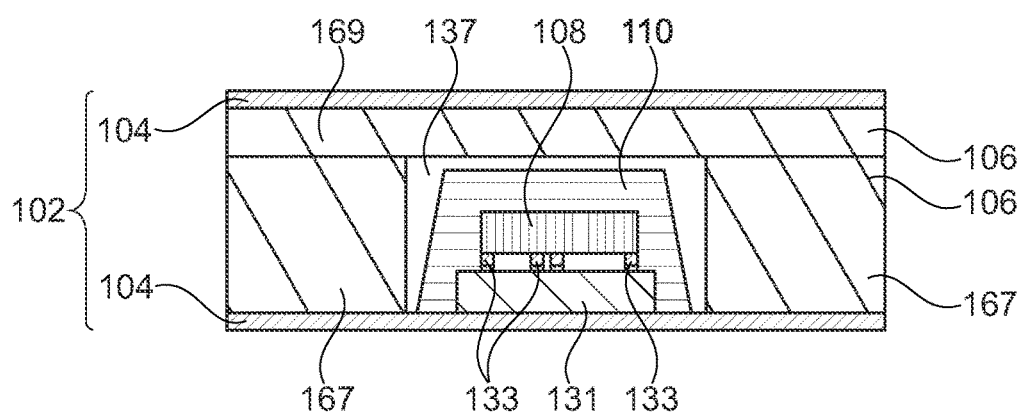

Referring to FIG. 4, the electronic component 108 covered by the sealing structure 110 may thereafter be embedded within stack 102. Stack 102 is composed of the bottom side electrically conductive layer structure 104 described above, one or more electrically insulating layer structures 106 (for instance comprising or consisting of resin, such as epoxy resin, with reinforcing particles embedded therein, for instance glass fibers) mentioned above, and a further electrically conductive layer structure 104 (such as a further copper foil) on top. For instance, the electrically insulating layer structures 106 may comprise a recessed core 167 (see cavity or recess 137) of fully cured material (for instance made of FR4) and a continuous layer 169 of at least partially uncured material (such as prepreg). The mentioned interconnection of the stack 102 may be accomplished by laminating, i.e. the application of pressure, if desired accompanied by heat. As a result of this lamination procedure, the material of the sealing structure 110 not only covers part of the component 108, but is now also in direct contact with part of the electrically insulating layer structures 106 and therefore functions as a spacer in between. The sealing structure 110 may thus form a material separating interface and may be sandwiched between component 108 and electrically insulating layer structures 106.

During such an interconnection procedure of embedding the electronic component 108, the one or more electrically insulating layer structures 106 and the one or more electrically conductive layer structures 104 may be placed laterally and/or on top and/or on the bottom of the arrangement shown in FIG. 3. One or more of the electrically insulating layer structures 106 may have recess 137 or through-hole, which may be formed by cutting out a portion of a corresponding pre-form of the respective electrically insulating layer structures 106. Component 108 with sealing structure 110 is embedded in recess 137. In the illustrated embodiment, one of the electrically insulating layer structures 106 (see reference numeral 169) comprises partially uncured dielectric materials such as prepreg. Consequently, applying elevated pressure and/or elevated temperature may cause melting of this at least partially uncured material, followed by an irreversible hardening upon releasing the applied high pressure and/or high temperature. In particular, the "at least partially uncured material" of the one or more electrically insulating layer structures 106 may comprise or consist of B-stage material and/or A-stage material. During the mentioned lamination procedure, the at least partially uncured material re-melts and flows into gaps in its environments. Therefore, also recess 137 may be filled with resin 139 of the one or more electrically insulating layer structures 106 during lamination. The recess 137 is shown in FIG. 4 and the resin 139 which has flown into the former recess 137 is shown in FIG. 5.

Conventionally, the flowable resin 139 may come into contact with the electronic component 110 embodied as semiconductor chip during the lamination procedure. Since such resin material of the electrically insulating layer structure 106 on the one hand and the semiconductor material of the electronic component 108 on the other hand have very different physical properties (in particular in terms of the Young modulus, the coefficient of thermal expansion, etc.), direct contact of resin 139 with the semiconductor material may cause significant stress to the component 108 during manufacture, during operation and during thermal cycles of the component carrier 100. Due to the provision of the sealing structure 110 according to the described embodiment of the invention, such a direct contact between resin and semiconductor material may be safely prevented, stress may be reduced and the reliability of the electronic component 100 may be improved.

Figure 5:
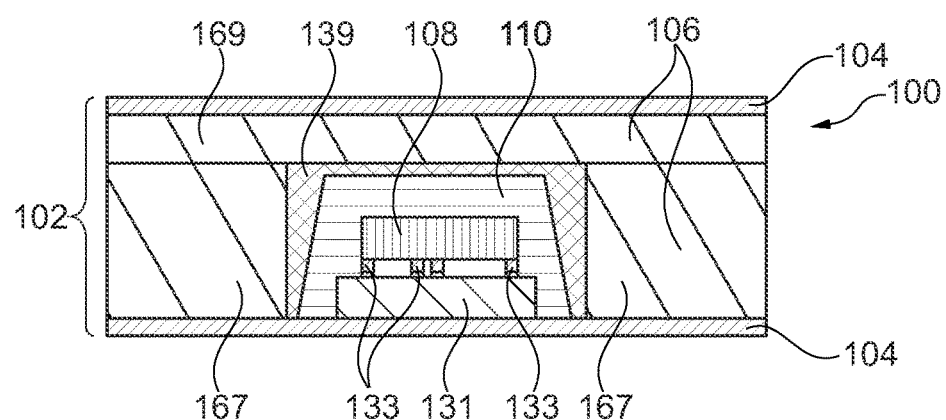

FIG. 5 illustrates component carrier 100, which is here embodied as a printed circuit board (PCB), according to an exemplary embodiment of the invention as obtained as a result of the described manufacturing process. The component carrier 100 comprises the interconnected stack 102 of electrically conductive layer structures 104 and electrically insulating layer structures 106, the semiconductor component 108 embedded in the stack 102 and arranged on the adhesive 131, and the sealing structure 110 sealing the component 108 and the adhesive 131 with regard to resin 139 of the electrically insulating layer structures 106.

As described above, the sealing structure 110 is configured for reducing stress between the component 108 and the stack 102, more precisely of the electrically insulating layer structures 106, even more precisely of the resin 139 thereof. Such stress may act on the component 108 in particular during the process of embedding (compare FIG. 4 and FIG. 5), during laser processing (for example for forming laser vias in terms of the formation of electrically conductive interconnects 143, compare FIG. 11), during operation of the manufactured component carrier 100 (where thermal cycles may occur, and where ohmic heat may be dissipated by the component 108).

Typically, silicon material of the component 108 may have a small value of the coefficient of thermal expansion of a few ppm/K. In contrast to this, resin 139 of the electrically insulating layer structures 106 may have a significantly higher value of the coefficient of thermal expansion of more than 100 ppm/K, in particular at high temperature. At the same time, the Young modulus of the silicon material of the component 108 can be very high, for instance significantly above 100 GPa. In contrast to this, the Young modulus of the resin 139 of the PCB-type electrically insulating layer structures 106 may be very small, for instance around 1 GPa. In view of these differences, a direct contact between the silicon material of the component 108 and the resin 139 of the electrically insulating layer structures 106 may cause significant stress. In a nutshell, the silicon material of the component 108 may have an about two orders of magnitude lower CTE and an about two orders of magnitude higher Young modulus than the resin 139 of the PCB stack 102. Similar considerations apply to other semiconductor or metallic materials of a component 108. Since reinforcing particles (such as glass fibers) of the electrically insulating layer structures 106 (for instance prepreg or FR4) do not re-melt during lamination and are therefore not (at least not to a large extent) in contact with the component 108 (in the absence of the sealing structure 110), issues with the resin 139 in terms of stress are usually more pronounced than those with the reinforcing particles.

As described and in order to reduce this stress, the sealing structure 110 is arranged to shield resin 139 of the electrically insulating layer structures 106 with regard to semiconductor (in particular silicon) material of the component 108 during lamination. A significant reduction of stress may be obtained when selecting a value of the Young modulus of the sealing structure 110 in between a value of the Young modulus of resin material of the electrically insulating layer structures 106 and a value of the Young modulus of silicon material of the component 108. Furthermore, the material selection may be carried out so that a value of the coefficient of thermal expansion (CTE) of the sealing structure 110 is in between a value of the coefficient of thermal expansion of resin 139 of the electrically insulating layer structures 106 and silicon material of the component 108.

Preferably, a material of the sealing structure 110 has a value of the thermal expansion coefficient between 5 ppm/K and 30 ppm/K, for instance 10 ppm/K. A value of the Young modulus of the material of the sealing structure 110 is preferably in a range between 5 GPa and 50 GPa, for instance 10 GPa. The value of the thermal expansion coefficient of the material of the sealing structure 110 may be preferably in a range of ±10% around an average of the value of the thermal expansion coefficient of the material of the component 108 and the value of the thermal expansion coefficient of the material of the electrically insulating layer structures 106. In a preferred embodiment, a value of the Young modulus of the sealing structure 110 is lower than an average value of the value of the Young modulus of the material of the component 108 and the value of the Young modulus of the material of the electrically insulating layer structures 106. Highly preferably, the value of the Young modulus of the sealing structure 110 is in a range between 30% and 45% of a sum of the value of the Young modulus of the material of the component 108 and a value of the Young modulus of the electrically insulating layer structures 106.

After re-solidification of the resin 139, the interconnected component carrier 100 according to FIG. 5 is obtained. During the lamination procedure as described, it is conventionally possible that resin material of the at least partially uncured electrically insulating layer structures 106 also flows towards the component 108 and may deteriorate its function. However, when the sealing structure 110 is applied, such a flow of resin towards the sensitive silicon material of the embedded component 108 may be safely prevented.

Moreover, the material of the sealing structure 110 may reduce thermal stress acting on the various constituents of the component carrier 100 during manufacture and during operation. In particular, it may have a value of the coefficient of thermal expansion intermediate between the structures in its interior and its exterior. This reduces thermal stress due to different thermal expansion of various constituents of the component carrier 100. At the same time, the material of the sealing structure 110 may also be sufficiently soft so as to be able to be compressed to balance out mechanical tensions in an interior of the component carrier 100. This reduces stress acting in an interior of the component carrier 100 and therefore reduces the risk of delamination of the layer structures 104, 106 as well as a deterioration or damage of the embedded component 108.

FIG. 6 to FIG. 11 illustrate different cross-sectional views of structures obtained during performance of a method of manufacturing a component carrier 100 according to another exemplary embodiment of the invention. The embodiment according to FIG. 6 to FIG. 11 uses a similar material for a sealing structure 110 but additionally adds filler particles 112 in the sealing structure 110 which, as an additional function, shield electromagnetic radiation propagating between an interior and an exterior of the component 108 to be embedded (when being embodied as a high frequency semiconductor chip).

As can be taken from FIG. 6, a copper foil is provided as electrically conductive layer structure 104. Alternatively, this copper foil may be substituted by another carrier foil, for instance made of aluminum.

As can be taken from FIG. 7, an adhesive depot is applied as adhesive 131 on a component mounting position of the electrically conductive layer structure 104. Such an adhesive 131 may be a thermally cured epoxy adhesive which may be applied by screen printing, dispensing, etc.

By a pick-and-place procedure, an electronic chip as component 108 may then be mounted on the adhesive 131, as shown in FIG. 8. Preferably, its pads 133 are facing towards the electrically conductive layer structure 104. Subsequently, the adhesive 131 may be thermally cured.

Next, as shown in FIG. 9, a sealing structure 110 made of a material as described above referring to FIG. 1 to FIG. 5 but additionally comprising metal filling particles 112 is applied on the component 108. This can be done by spraying, printing or dispensing. As can be taken from a detail 141, the metal particles 112 are embedded in a polymer matrix 114. The metal particles 112 (for instance made of a ferromagnetic material) are configured for suppressing propagation of radiofrequency radiation between the component 108 and an exterior of the sealing structure 110. More specifically, the particles 112 of the sealing structure 110 are configured for absorbing radiofrequency radiation. The particles 112 therefore prevent or at least suppress electromagnetic radiation from propagating from the embedded component 108 to an exterior of the component carrier 100, from an exterior of the component carrier 100 to the embedded component 108, and optionally between different embedded components 108 within one and the same component carrier 100. This increases the electric reliability of the component carrier 100 and renders the latter in particular appropriate for high frequency applications. Preferably, the material of the polymer matrix 114 may be selected to provide the above described stress reduction. The material of the particles 112 may be selected to provide an EMI (electromagnetic interference) shielding function. This allows a user to specifically design the stress reduction properties (by correspondingly adjusting the material of the matrix 114) and the EMI shielding properties (by correspondingly adjusting the material of the particles 112) of the component carrier 100 under manufacture.

As can be taken from FIG. 10, the structure according to FIG. 9 is then embedded within a stack 102 of electrically conductive layer structures 104 and electrically insulating layer structures 106. Thereby, the shown arrangement is interconnected to form an integral body.

FIG. 11 shows how an electric connection between the embedded electronic component 108 and an exterior of the component carrier 100 is accomplished. For this purpose, the pads 133 of the embedded electronic component 108 are exposed for instance by (preferably laser) drilling, thereby forming (for instance laser) vias. Subsequently, copper may be deposited or plated (for instance chemically or galvanically) in the vias (functioning as access holes) to form electrically conductive interconnects 143.

Figure 12:
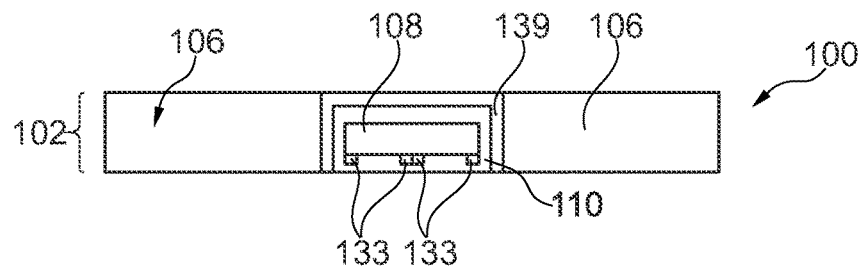
FIG. 12, FIG. 13, FIG. 14 and FIG. 15 illustrate different cross-sectional views of component carriers according to other exemplary embodiments of the invention.
Figure 13:
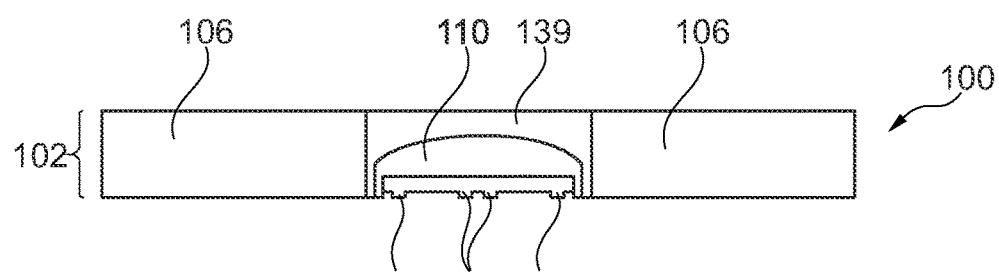
Figure 14:
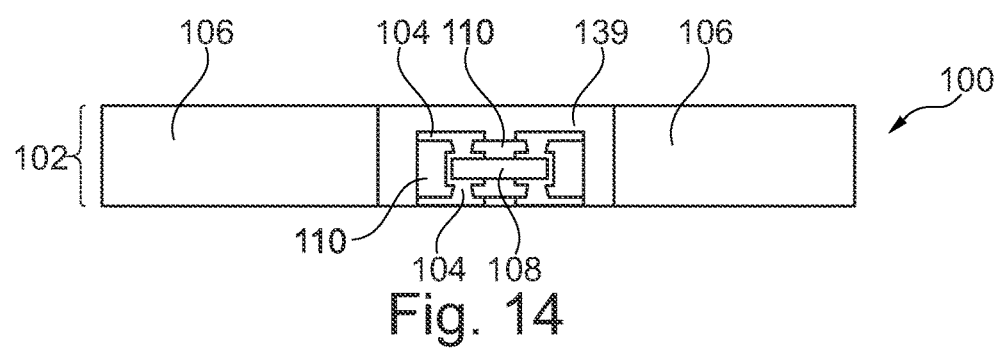

FIG. 12 to FIG. 14 illustrate different cross-sectional views of component carriers 100 according to other exemplary embodiments of the invention. It should be appreciated that the geometry obtained by the embodiments described above referring to FIGS. 1 to 5 and FIGS. 6 to 11 are only exemplary. For this purpose, FIG. 12, FIG. 13 and FIG. 14 show other embodiments which can be obtained in a similar way. According to FIG. 12, the electronic component 108 is hermetically sealed by and therefore fully circumferentially in contact with material of the sealing structure 110. According to FIG. 13, a lower main surface of the electronic component 108 is exposed so that pads 133 of the component 108 form part of the exterior surface of the component carrier 100. FIG. 14 shows a component carrier 100 with an embedded electronic component 108 having electrically conductive and/or thermally conductive contacts at both opposing main surfaces thereof (see reference numeral 104).

Figure 15:
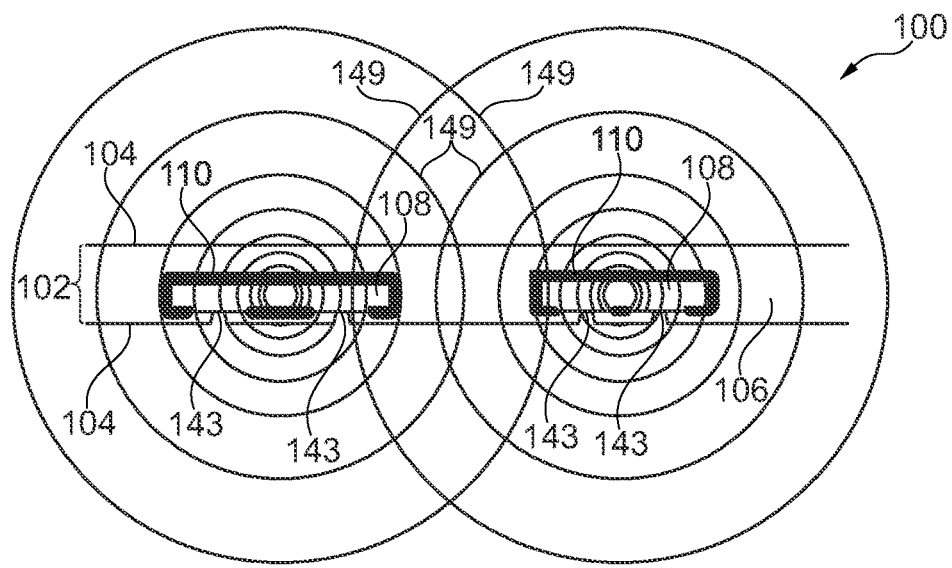

The embodiment of FIG. 15 shows a component carrier 100 in a configuration in which two components 108 both emitting electromagnetic radiation 149 are embedded in stack 102. However, since they are surrounded at least partially by the sealing structure 110, they are not only arranged with low mechanical stress and temperature robust, but also propagation of electromagnetic radiation 149 between these components 108 as well as between the components 108 and an electronic periphery around the component carrier 100 may be strongly suppressed. Therefore, a highly reliable component carrier 100 can be obtained in terms of both stress reduction and EMI protection.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
a stack comprising at least one electrically conductive layer structure and at least one electrically insulating layer structure;
a component embedded in the stack; and
a sealing structure sealing at least part of the component with regard to material of the stack, wherein the sealing structure is configured for reducing stress between the component and the stack;
wherein a value of a coefficient of thermal expansion of the sealing structure is in between a value of the coefficient of thermal expansion of resin material of the at least one electrically insulating layer structure and a semiconductor material of the component.

2. The component carrier according to claim 1, wherein the sealing structure is configured for reducing stress exerted during embedding the component and/or during laser processing the component carrier and/or when operating the component carrier.

3. The component carrier according to claim 1, wherein the sealing structure is arranged to shield resin material of the at least one electrically insulating layer structure with regard to the component.

4. The component carrier according to claim 1, wherein the sealing structure is arranged to shield material of the at least one electrically insulating layer structure with regard to a semiconductor material of the component.

5. The component carrier according to claim 1, wherein a value of the Young modulus of the sealing structure is in between a value of the Young modulus of resin material of the at least one electrically insulating layer structure and a value of the Young modulus of a semiconductor material of the component.

6. The component carrier according to claim 1, wherein a material of the sealing structure comprises resin, or epoxy resin, with filler particles comprising at least one of copper, a ceramic, and glass.

7. The component carrier according to claim 1, wherein a material of the sealing structure has a value of a coefficient of thermal expansion in a range between 5 ppm/K and 40 ppm/K.

8. The component carrier according to claim 1, wherein a value of the Young modulus of a material of the sealing structure is in a range between 5 GPa and 500 GPa.

9. The component carrier according to claim 1, comprising at least one of the following features:
- a value of a coefficient of thermal expansion of the material of the sealing structure is in a range of ±30% around an average of the value of the coefficient of thermal expansion of the material of the component and the value of the coefficient of thermal expansion of the material of the at least one electrically insulating layer structure;
- a value of the Young modulus of the sealing structure is lower than an average value of the value of the Young modulus of the material of the component and the value of the Young modulus of the material of the at least one electrically insulating layer structure; wherein the material of the sealing structure is configured for dissipating heat generated within the component carrier;
- wherein the material of the sealing structure directly contacts at least part of the component and directly contacts at least part of the at least one electrically insulating layer structure;
- wherein the material of the sealing structure is configured for shielding electromagnetic radiation, in particular radiofrequency radiation, between the component and an exterior of the sealing structure;
- wherein the material of the sealing structure is configured for absorbing electromagnetic radiation, in particular radiofrequency radiation.

10. The component carrier according to claim 1, wherein the material of the sealing structure comprises shielding particles configured for shielding electromagnetic radiation.

11. The component carrier according to claim 10, comprising at least one of the following features:
- wherein the particles are selected from a group consisting of metallic particles, ferromagnetic particles, graphite particles, silver particles and nickel particles;
- wherein the material of the sealing structure comprises a matrix in which the particles are embedded.

12. The component carrier according to claim 1, comprising at least one of the following features:
- wherein the component is selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip;
- wherein the at least one electrically conductive layer structure comprises at least one of the group consisting of copper, aluminum, nickel, silver, gold, palladium, and tungsten, any of the mentioned materials being optionally coated with supra-conductive material such as graphene;
- wherein the at least one electrically insulating layer structure comprises at least one of the group consisting of resin, reinforced or non-reinforced resin, epoxy resin, Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;
- wherein the component carrier is shaped as a plate;
- wherein the component carrier is configured as one of the group consisting of a printed circuit board, and a substrate;
- wherein the component carrier is configured as a laminate-type component carrier.

13. A method of manufacturing a component carrier, the method comprising:
- embedding a component in a stack comprising at least one electrically conductive layer structure and at least one electrically insulating layer structure;
- sealing at least part of the component with regard to material of the stack by a sealing structure; and
- configuring the sealing structure to reduce stress between the component and the stack;
- wherein a value of a coefficient of thermal expansion of the sealing structure is in between a value of the coefficient of thermal expansion of resin material of the at least one electrically insulating layer structure and a semiconductor material of the component.

14. The method according to claim 13, comprising at least one of the following features:
- wherein the method comprises simulating a stress behavior of the component carrier with the sealing structure and modifying the configuration of the sealing structure when the simulation indicates a reduction of the stress with the modified configuration;
- wherein the method further comprises configuring the sealing structure based on one or a combination of the criteria of at least partially balancing a mismatch between a value of a coefficient of thermal expansion of the component and a value of a coefficient of thermal expansion of the at least one electrically insulating layer structure, and at least partially balancing a mismatch between respective values of a Young modulus of the component and of the at least one electrically insulating layer structure;
- wherein the method further comprises considering as a criterion for configuring the sealing structure a shrinkage behavior of a material of the at least one electrically insulating layer structure.

* * * * *